United States Patent [19]

Wagstaff

[11] 4,124,266

[45] Nov. 7, 1978

[54] ELECTRICAL CONNECTING MEANS

[75] Inventor: John B. Wagstaff, Newtown Linford, England

[73] Assignee: Pressac Limited, Long Eaton, England

[21] Appl. No.: 806,710

[22] Filed: Jun. 15, 1977

[30] Foreign Application Priority Data

Jun. 18, 1976 [GB] United Kingdom ............... 25341/76

[51] Int. Cl.² ............................................. H01R 11/20
[52] U.S. Cl. .............................. 339/97 C; 339/112 R; 339/176 MF
[58] Field of Search .............. 339/17 F, 17 LC, 97 C, 339/112 R, 176 MF

[56] References Cited

U.S. PATENT DOCUMENTS

| 2,993,188 | 7/1961 | Anderson | 339/17 LC |
| 3,395,381 | 7/1968 | Huffnagle | 339/97 C |
| 4,003,623 | 1/1977 | Reynolds | 339/97 C |

FOREIGN PATENT DOCUMENTS 2,500,556 7/1975 Fed. Rep. of Germany ........ 339/97 C Primary Examiner—Joseph H. McGlynn
Attorney, Agent, or Firm—Hans Berman

[57] ABSTRACT

An electrical contact to be made between an electrically insulated first conductive strip and a socket member having an electrical contact element therein in which a crimpable, electrically conducting, second strip is caused to pierce the first strip at two separate points after which the passed-through ends of the second strip are folded over into a region of the first strip between the two pierced points to pierce again the insulation of the first strip to effect a second electrical connection with the first strip, and the resultant crimped joint is then inserted into the socket member until at least two electrical connecting points are established between the crimped second strip and the contact element in the socket member.

6 Claims, 8 Drawing Figures

ELECTRICAL CONNECTING MEANS

The present invention relates to the establishing of electrical contact between an electrically insulated conductive strip and a socket member having an electrical contact element therein.

The primary object of the invention is to improve the degree of electrical contact between the insulated strip and the socket contact element and to make provision for dissipating heat generated by such electrical contact.

According to the present invention electrical contact between an electrically insulated conductive strip and a socket member having an electrical contact element therein is provided by (1) the application of a crimping tool to pierce the insulated conductive strip at two points spaced apart with the ends of a crimpable strip of flexible, resilient, electrically conducting material to make a first electrical connection with the insulated strip and to fold over the passed through ends of the crimpable strip into a region of the insulated strip between the said two piercing points and again to pierce the insulation of the insulated conductive strip to effect a sound electrical connection with the insulated strip, and (2) the insertion of the resultant crimped joint into the said socket member whereby at least two electrical connecting points are established between the crimped strip and the said contact element in the socket member, and an air channel is formed between the said contact element and the crimped strip to cool the said connecting points. Preferably at least one air channel is formed within the crimped strip to effect cooling of at least one of the electrical connecting points. Expediently the crimped strip takes the form of a "B"-shape with the doubly curved part of the B-shape adapted to form two electrical connecting points with the said contact element, e.g. a cantilever spring contact. Opposite ends of the crimpable strip may be provided with teeth extending in the plane of the strip: in such an event parallel serrations projecting perpendicularly to the plane of the strip and joining the teeth at the ends of the strip may be provided.

This invention is especially applicable to the establishment of electrical contact between an electrically insulated conductive strip of a flat flexible printed wiring and a cable mounted printed circuit edge connector but is not limited thereto.

By way of example, preferred embodiments of the invention will now be described with reference to the accompanying diagrammatic drawings (other than FIG. 5) wherein:

FIG. 3b is a section along line X—X of FIG. 3a;

Figure 3A:
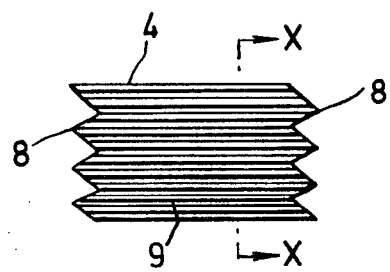
FIG. 3a is a plan view of the crimpable strip before crimping.
Figure 3B:

A crimpable strip 4 of flexible, resilient, electrically conducting material is shown in its flattened position in FIGS. 3a and 3b. FIG. 3a shows teeth 8 to facilitate piercing and FIG. 3b shows longitudinal serrations or ribs 9 to connect the teeth 8 and give multi-point contact at positions 6 as well as at 2 (FIG. 1).

Figure 2:
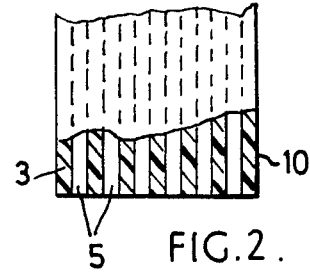
FIG. 2 shows part of the flexible printed wiring circuit element.

A flexible printed wiring circuit element 10 is show at FIG. 2, this consisting of electrically conductive copper strips 5 arranged parallel to another and separated from one another by insulation 3.

Figure 1:
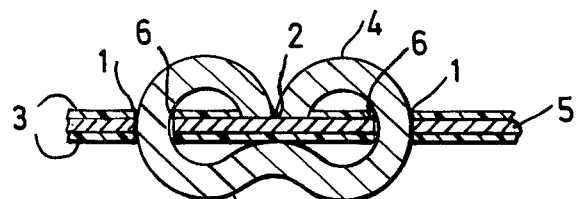
FIG. 1 is a sectional elevation of a crimpable electrically conducting strip which has been applied by a crimping tool to a conductive strip of a flexible printed wiring circuit element.

FIG. 1 shows a crimpable strip 4 which has been applied with a crimping tool (not shown) to a copper strip 5 of the circuit element 10 as shown. The end portions of the strip 4 pierce the copper strip 5 and the layers of insulation 3 on opposite longitudinal faces of the strip 5 and makes electrical connection with the edges 1 of the strip 5. The free terminal parts of the crimped strip 4 pierce the insulation 3 making a second point of electrical connection at 2. In the crimped state the strip 4 takes the form of a B-shape whose central region 7 is dished, but may be linear as in the modified strip 4a shown in FIGS. 6 and 7.

Figure 4:
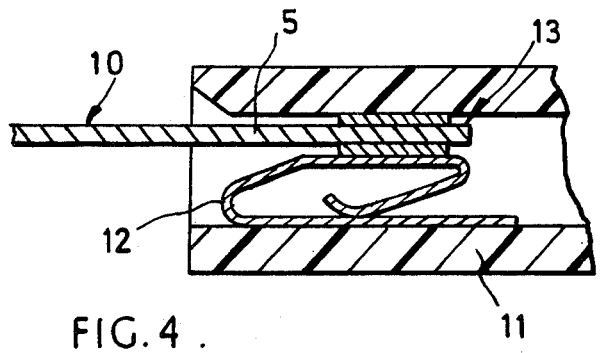
FIG. 4 is a sectional elevation of part of the flexible printed wiring circuit element to which has been applied a crimped strip as shown in FIG. 1 and a housing provided with an electrical connector into which the crimped joint is introduced.

FIG. 4 shows the crimped joint denoted by arrow 13 inserted into the cavity a conventional printing circuit edge connection socket consisting of a housing 11 with a cantilever spring contact 12.

With the embodiments described and illustrated it will be understood that it is not necessary to remove the insulation 3 (insulation removal often being awkward and inconvenient) which covers the conductive strips 5 in order to terminate the strip 5 onto a conventional printing circuit edge connector.

Figure 5:
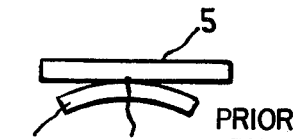
FIG. 5 is a sketch showing a conventional arrangement.
Figure 6:
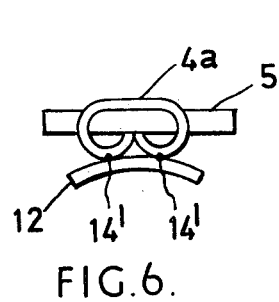
FIG. 6 is an arrangement illustrative of the invention for comparison with FIG. 5.

FIG. 5 is not illustrative of the invention but represents conventional practice, a single connecting point 14 being established between a conventional copper strip 5 and a conventional cantilever spring contact 12 of a conventional printing circuit edge connection socket. By way of comparison a corresponding embodiment illustrative of the invention is shown in FIG. 6. A crimped strip 4a comparable to that shown in FIG. 1 serves to connect a conventional copper strip 5 with a conventional cantilever spring contact 12. By virtue of the B-shape of the strip 4a two connecting points 14' are established.

Figure 7:
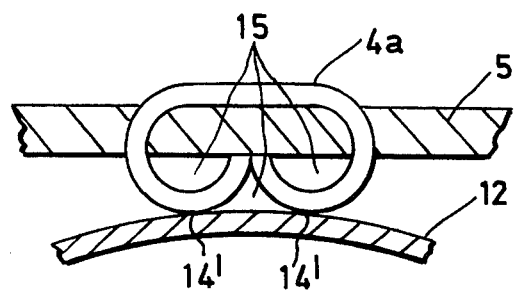
FIG. 7 is a sectional view similar to FIG. 6 showing the provision of cooling channels.

FIG. 7 is similar to FIG. 6 but the latter is on a larger scale. Channels 15 serve to cool the connecting points 14'. It will be appreciated that the increase in the amount of air around the contacting faces of members 4a and 12 means that more of the heat generated at the contacting faces will be removed by convection or air circulation.

What we claim is:

1. Connecting means comprising:
    (a) an elongated first strip of electrically conductive material having two opposite longitudinal faces;
    (b) a layer of insulating material covering each of said faces;
    (c) a crimpable second strip of flexible, resilient, electrically conductive material having two end portions,
        (1) said second strip piercing said first strip and said layers of insulating material at two longitudinally spaced points of said first strip in electrical contact with the material of said first strip, (2) two end portions of said second strip projecting from one of said layers at said two points respectively, and a portion of said second strip intermediate said end portions being superposed on the other one of said layers, (3) said two end portions being directed toward each other and having respective terminal parts penetrating said one layer and making additional electrical contact with said first strip;

(d) a socket member bounding a cavity therein; and (e) a contact element in said cavity, (1) said second strip and the portion of said first strip pierced by said second strip being releasably received in said cavity, (2) said second strip and said socket member engaging each other in electrical contact in at least two contact points, (3) said second strip and said socket member bounding an air channel adjacent said contact points.

2. Connecting means as set forth in claim 1, wherein one of said portions and one of said layers bound an air space adjacent one of said contact points.

3. Connecting means as set forth in claim 1, wherein said end portions of said second strip engage said contact element at said two contact points respectively.

4. Connecting means as set forth in claim 1, wherein said contact element is a cantilever spring element.

5. Connecting means as set forth in claim 1, wherein said terminal parts are each formed with teeth penetrating said one layer.

6. Connecting means as set forth in claim 5, wherein said second strip is formed with elongated ribs transversely projecting from said second strip and connecting respective teeth on said terminal parts.

* * * * *